(12) United States Patent
Kohno

(10) Patent No.: US 6,907,585 B2
(45) Date of Patent: Jun. 14, 2005

(54) SEMICONDUCTOR INTEGRATED CIRCUIT AND ITS DESIGN METHODOLOGY

(75) Inventor: Ichiro Kohno, Kokubunji (JP)

(73) Assignee: Renesas Technology Corporation, Tokyo (JP)

( * ) Notice: Subject to any disclaimer, the term of this patent is extended or adjusted under 35 U.S.C. 154(b) by 231 days.

(21) Appl. No.: 10/410,283

(22) Filed: Apr. 10, 2003

(65) Prior Publication Data

US 2003/0200495 A1 Oct. 23, 2003

(30) Foreign Application Priority Data

Apr. 17, 2002 (JP) .................................. P2002-114114

(51) Int. Cl.[7] .............................................. G06F 17/50
(52) U.S. Cl. ........................................ 716/4; 714/738
(58) Field of Search ......................... 716/4, 5; 714/738

(56) References Cited

U.S. PATENT DOCUMENTS 5,377,197 A * 12/1994 Patel et al. .................. 714/724
6,205,572 B1 * 3/2001 Dupenloup .................... 716/5
6,216,254 B1 * 4/2001 Pesce et al. ................... 716/5
6,484,294 B1 * 11/2002 Kiyoshige et al. ............ 716/4
6,536,024 B1 * 3/2003 Hathaway ..................... 716/6

OTHER PUBLICATIONS

Yervant Zorian, "A Distributed BIST Control Scheme for Complex VLSI Devices", IEEE, Mar. 1993, pp. 4–9.
"Design for AT–Speed Test, Diagnosis and Measurement" (textbook), Chapter 3 Logic Test and Diagnosis, pp. 86–89.

* cited by examiner

*Primary Examiner*—Stacy A. Whitmore
(74) *Attorney, Agent, or Firm*—Reed Smith LLP; Stanley P. Fisher, Esq.; Juan Carlos A. Marquez, Esq.

(57) ABSTRACT

A method and device are provided for applying logic BIST at speed for large-scale and high-performance logic circuits without increasing test time, and decreasing test costs as a result. In one example, a logic BIST controller is divided into two portions. A clock signal having a small delay is used to drive a partial circuit that supplies a user circuit with a scan enable signal and a clock signal. A clock signal having a large delay is used to drive a partial circuit that supplies the user circuit with a test pattern and collects a test result.

10 Claims, 12 Drawing Sheets

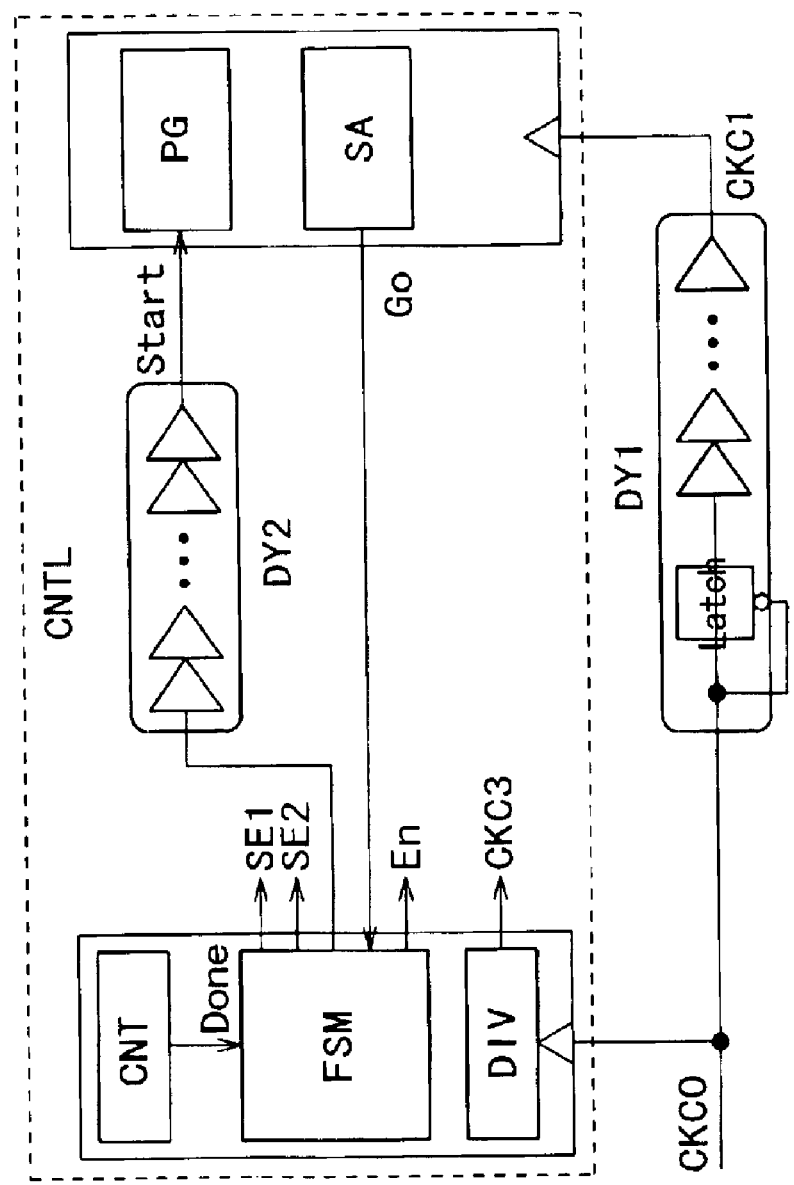
F I G. 5

SEMICONDUCTOR INTEGRATED CIRCUIT AND ITS DESIGN METHODOLOGY

BACKGROUND OF THE INVENTION

1. Field of the Invention

The present invention generally relates to a semiconductor integrated circuit and, more particularly, to a semiconductor integrated circuit having a logic circuit including storage elements.

2. Discussion of Background

Logic BIST (Built-In Self Test) has become to be widely used in order to avoid increasing tester investments resulting from availability of large-scale and high-performance logic circuits. Logic BIST uses a fault-detecting logic BIST controller installed on a semiconductor integrated circuit chip and enables testing at the same operating frequency (i.e., "at speed") as for normal operations even on a low-cost tester having low operating frequencies.

Processes of applying logic BIST to logic circuits will be described with reference to the accompanying drawings. FIG. 11 (PRIOR ART) is a circuit configuration diagram showing a conventional logic BIST controller. A configuration of a conventional logic BIST controller is discussed in further detail in "Design for At-speed Test, Diagnosis and Measurement" (Kluwer Academic Publishers, pp. 86–88, 1999).

A logic BIST controller CNTL includes a pattern generator PG to sequentially supply generated test patterns to a user circuit CUT, a signature analyzer SA to check for faults based on a test result acquired from the user circuit CUT, a counter CNT to count the number of generated patterns and check for test completion, a frequency divider DIV to divide a clock signal and supply it to the user circuit, and a control signal generator FSM to control the overall test operation. The user circuit CUT comprises a scan FF with MUX (scan FF) and a combinational circuit CL. The scan FF contains a multiplexer provided before a flip-flop. Each scan FF has two input terminals. One terminal is connected to the combinational circuit CL. The other terminal is connected to an output terminal of the preceding scan FF. A signal path, called a scan path, is formed by connecting between input/output terminals of the scan FFs. The scan path is used to sequentially input test patterns to each scan FF via a scan-in signal line SI and sequentially output test results via a scan-out signal line SO.

A scan enable signal line SE is connected to an input selection terminal of the MUX constituting the scan FF. The scan enable signal line SE is used to control whether the scan FF should select to incorporate a signal from the combinational circuit CL or from the scan path. According to the configuration example in FIG. 11 (PRIOR ART), the user circuit CUT is supplied with clock signals CK1 and CK2 having different frequencies. During a normal operation, selectors SEL1 and SEL2 select and output system clocks CKC0 and CKC2 as the clock signals CK1 and CK2. During a test operation, the selectors SEL1 and SEL2 select and output an output signal CKC3 from a 2-input AND gate and an output signal CKC4 from a frequency divider DIV as the clock signals CK1 and CK2. During BIST execution, the frequency divider DIV supplies the clock signal CK2 mainly because the BIST execution needs to supply a clock resulting from synchronization between the clock signal CK1 and the clock signal CK2.

A delay circuit DY is inserted on a clock signal line connected to the logic BIST controller CNTL. Normally, delays for the clock signals CK1 and CK2 to drive the user circuit are substantially larger than those for the clock signal CKC1 to drive the logic BIST controller CNTL. (Here, a delay means a time interval needed for propagating a signal on a path from an output terminal of an FF transmitting that signal to an input terminal of an FF receiving the signal.) This large difference is because the scale of the user circuit is substantially larger than that of the logic BIST controller, and the user circuit supports a larger clock-related fan-out count than the logic BIST controller. According to the prior art, the delay circuit DY is used to eliminate a delay difference (hereafter referred to as a skew) between clock signals to drive the logic BIST controller CNTL and the user circuit CUT, and both are designed to operate synchronously.

FIG. 12 (PRIOR ART) is a timing chart showing operations of the conventional logic BIST controller. Logic BIST repeats the following operations for the number of test patterns: (1) supplying a test pattern to each scan FF in the user circuit (scan-in operation A); (2) propagating the test pattern to the combinational circuit from each scan FF and incorporating a test result output from the combinational circuit into each scan FF (logic test operation B); and (3) collecting the test result from each scan FF (scan-out C). Logic BIST performs the test operations with respect to all test patterns, and then checks for a fault (fault determination operation D).

The scan-in and scan-out operations are collectively referred to as scan operations. During scan operations, the 2-input AND gate in FIG. 11 (PRIOR ART) partially suppresses transition of the clock signal CK1 for driving the user circuit and decreases the operating frequency (s1401). Since a scan operation consumes power for the entire circuit several times more than that consumed for normal operations, an excess voltage drop may cause incorrect detection of faults, or heat generation may cause chips to be damaged. The clock signal frequency is decreased during scan operations in order to save power consumption for the user circuit and correctly perform the test.

It is necessary to propagate a signal in the logic BIST controller CNTL and the user circuit CUT within a period from a rising edge of a clock signal driving an FF to transmit that signal to a rising edge of a clock signal driving an FF to receive that signal (setup time restriction). For example, a scan enable signal SE1 is propagated between a rising edge of a clock signal CKC1 to drive the transmitting logic BIST controller CNTL and the next rising edge of the clock signal CK1 to drive the receiving user circuit CUT (s1402). Likewise, a clock enable signal En is propagated between a rising edge of the transmitting clock signal CKC1 and the next rising edge of a clock signal CKC0 whose propagation should be inhibited (s1403). When the clock signal CK2 drives the transmitting FF and the clock signal CK1 drives the receiving FF, the signal is propagated between a rising edge of the CK2 and the next rising edge of the CK1 (s1404). In addition, it is necessary to propagate a signal in the logic BIST controller CNTL and the user circuit CUT after a rising edge immediately preceding the most recent rising edge of a clock signal driving the FF to receive that signal (hold time restriction). When the clock signal CK1 drives the transmitting FF and the clock signal CK2 drives the receiving FF, for example, the signal is propagated after a rising edge immediately preceding the most recent one for the CK2 (s1405).

As logic circuits are designed for larger scales and higher performances, however, delays DSE1 and DSE2 of the scan enable signal and delays DCK1 and DCK2 of the clock signal become considerably larger than a clock cycle T. This is because progress towards the large-scale integration increases the number of FFs to be driven by the scan enable signals SE1 and SE2 and clock signals CK1 and CK2, and progress towards the higher performance shortens the clock cycle T. Accordingly, for example, the setup time restriction cannot be satisfied between r1402 and r1404, disabling at-speed logic BIST. As a result, tester investments may increase. In order to satisfy the hold time restriction at r1405, for example, inserting many buffers on the CK1 drive data signal line may increase a chip area.

To solve this problem, there is a proposed a method of dividing the logic circuit and sequentially testing each of the divided logic circuits. This method is discussed in further detail in Proceedings of 11th International VLSI Test Symposium, pp. 4–9, 1993. This method can shorten delays by decreasing the number of FFs simultaneously driven by the scan enable signal and the clock-signal. However, this method extends the time for test (test time) and increases test costs as a result.

Consequently, conventional methods have the problem of applying logic BIST to large-scale and high-performance logic circuits, and thereby disabling an at-speed test or increasing the test time.

SUMMARY OF THE INVENTION

An object of the present invention is to shorten delays for the scan enable signal and the clock signal, enable to apply logic BIST at speed to large-scale and high-performance logic circuits without increasing the test time, and, as a result, decrease test costs. It should be appreciated that the present invention can be implemented in numerous ways, including as a process, an apparatus, a system, a device or a method. Several inventive embodiments of the present invention are described below.

In one embodiment, a semiconductor integrated circuit apparatus comprises a logic circuit having one or more flip-flops and one or more combinational circuits; and a test control circuit having a control circuit to output a control signal for controlling connection states of the flip-flop and a pattern generation circuit to generate a test pattern for the logic circuit, wherein when the control signal is in a first state, each of the one or more flip-flops is connected to other flip-flops without passing through the one or more combinational circuits and transmits a test pattern generated from the pattern generation circuit to the other flip-flops; and wherein when the control signal is in a second state, each of the one or more flip-flops is connected to any of the one or more combinational circuits and outputs a stored test pattern to the connected combinational circuit, and a phase of a clock signal to drive the control circuit advances further than a phase of a clock signal to drive the pattern generation circuit.

A delay circuit is used to adjust phases. When the delay circuit is configured to be variable, the delay circuit can flexibly respond to changes in the operating temperature and the operating voltage. The variable delay circuit should be able to output a signal indicative of compensation completion to the outside.

Such an semiconductor integrated circuit apparatus can be implemented by arranging a logic circuit and a test control circuit; performing a clock tree synthesis for the logic circuit and the test control circuit; calculating a first delay of a clock signal supplied to flip-flops of the logic circuit and a second delay of a clock signal supplied to a pattern generation circuit of the test control circuit; and rewiring clock routing to the pattern generation circuit so as to decrease a difference between the first delay and the second delay.

The present invention makes it possible to apply logic BIST at speed to large-scale and high-performance logic circuits without increasing the test time, and, as a result, decrease test costs. The invention encompasses other embodiments of a method and an apparatus, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

FIG. 5 is a timing chart showing operations of the clock cycle extension circuit, in accordance with one embodiment of the present invention.

DESCRIPTION OF THE PREFERRED EMBODIMENTS

An invention for an integrated circuit that applies logic BIST at speed for large-scale and high-performance logic circuits without increasing test time is disclosed. Numerous specific details are set forth in order to provide a thorough understanding of the present invention. It will be understood, however, to one skilled in the art, that the present invention may be practiced without some or all of these specific details.

Figure 1:
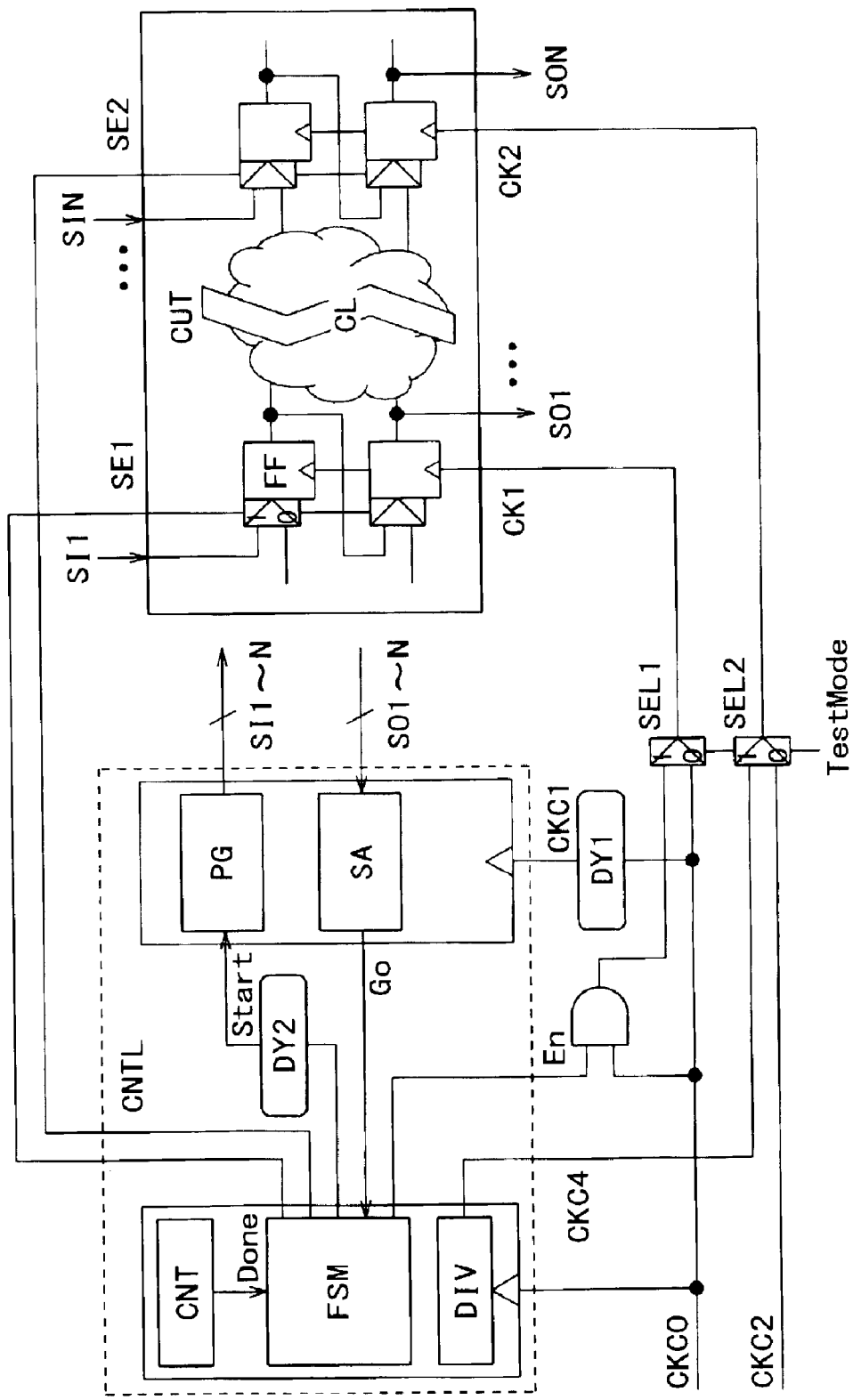
FIG. 1 is a circuit configuration diagram showing a semiconductor integrated circuit, in accordance with one embodiment of the present invention.

FIG. 1 is a circuit configuration diagram showing a semiconductor integrated circuit, in accordance with one embodiment of the present invention. In this example, a user circuit CUT is supplied with clock signals CK1 and CK2 having different frequencies. A scan enable signal SE1 is supplied to a flip-flop operating in synchronization with a clock signal CK1. A scan enable signal SE2 is supplied to a flip-flop operating in synchronization with a clock signal CK2. When the user circuit CUT is supplied with clock signals having k types of frequencies different from each other, scan enable signals 1 to k are supplied to the corresponding clock signals. Scan-in signal lines divide flip-flops of the user circuit CUT into N groups and connect the divided flip-flops to form a scan path. The value N just needs to be determined according to a scale of the user circuit CUT. Clock signals CKC0 and CKC2 may be supplied from a clock source outside the semiconductor integrated circuit or from a clock signal generator inside the semiconductor integrated circuit.

The configuration in FIG. 1 divides a logic BIST controller CNTL into two portions and drive each of them using clock signals having different delays. A counter CNT, a control signal generator FSM, and a frequency divider DIV operate on a system clock CKC0. The control signal generator FSM outputs scan enable signals SE1 and SE2 to the user circuit CUT. The frequency divider DIV generates a clock signal CKC4 during a scan operation. These signals generate large fan-out counts and cause large delays. The counter CNT is a circuit that operates in synchronization with the control signal generator FSM. By contrast, a pattern generator PG and a signature analyzer SA operate on a clock signal CKC1 having a larger delay than CKC0. It is preferable that the clock signal CKC1 has the same delay as that of the clock signal CK1 driving the user circuit. For example, the pattern generator PG outputs a scan-in signal having fan-out count 1, hardly causing a delay. For this reason, it is desirable that the pattern generator PG and the signature analyzer SA operate in synchronization with the user circuit CUT. A delay circuit DY1 is used to generate the clock signal CKC1 from the clock signal CKC0. The clock signal CKC1 driving the pattern generator PG causes a larger delay than that of the clock signal CKC0 driving the control signal generator FSM. A delay circuit DY2 should be provided so that a signal Start indicating the beginning of pattern generation satisfies hold time restrictions.

Figure 2:
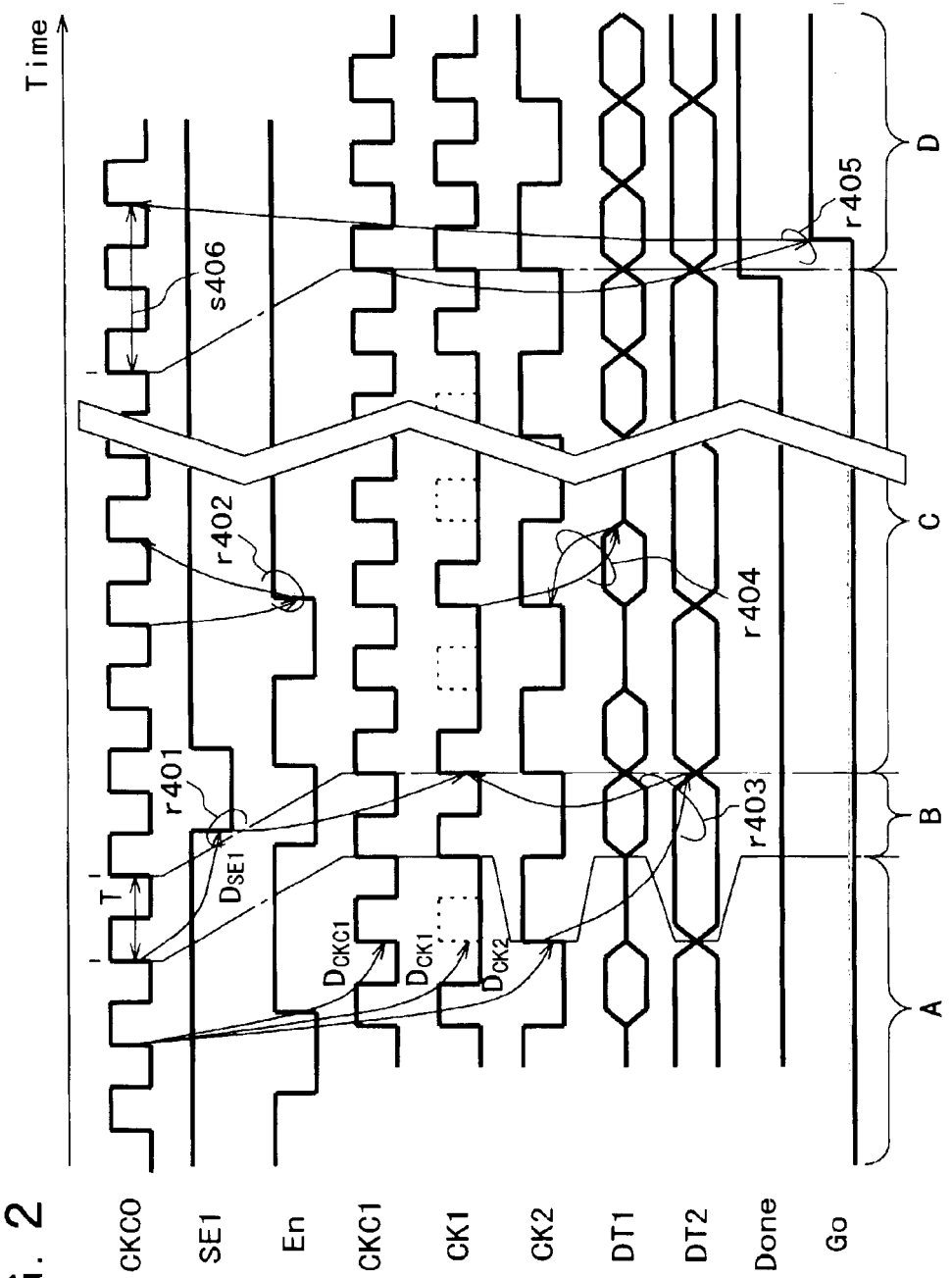
FIG. 2 is a timing chart showing operations of the configuration discussed with reference to FIG. 1, in accordance with one embodiment of the present invention.
Figure 11:
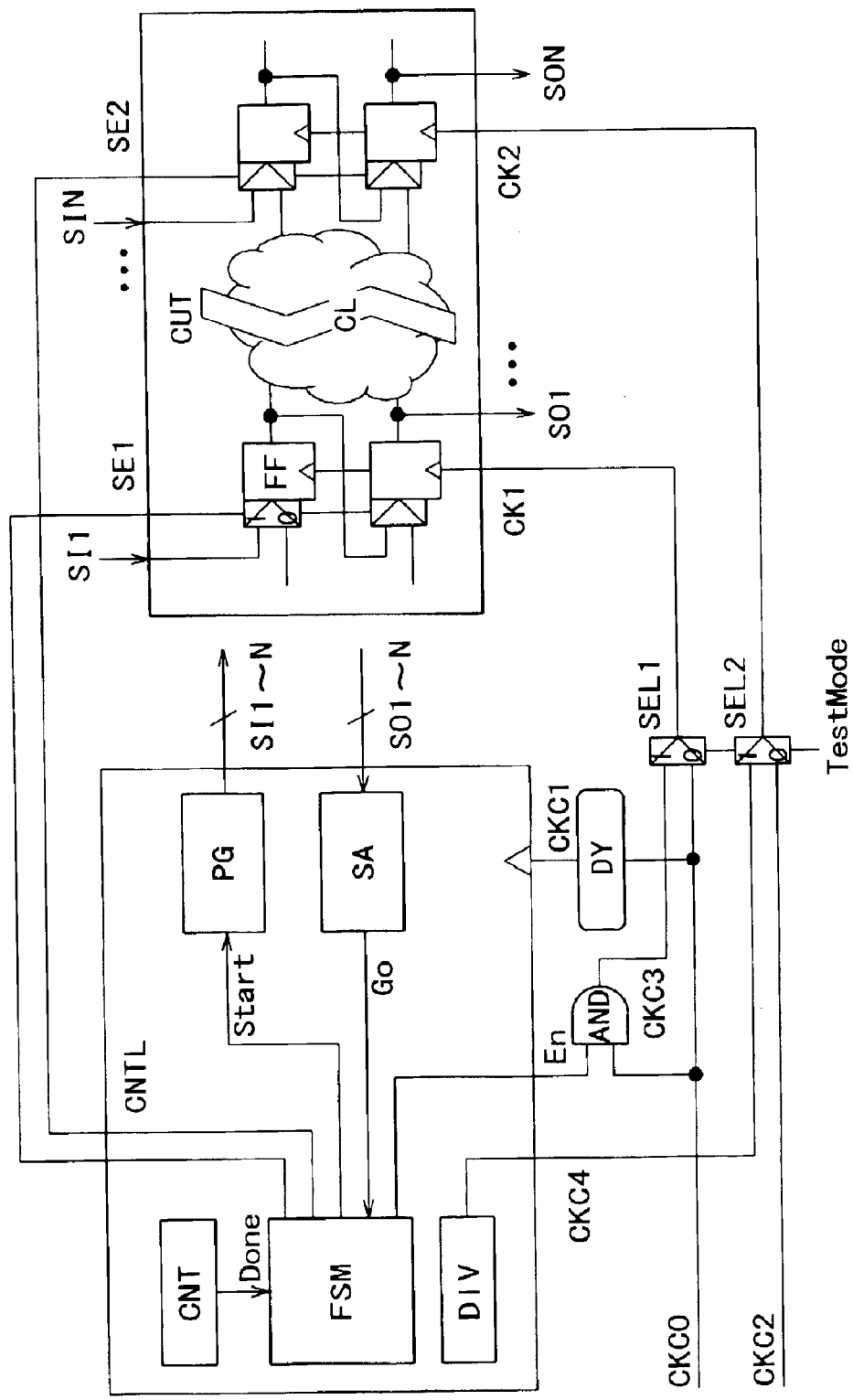
FIG. 11 (PRIOR ART) is a circuit configuration diagram showing a conventional logic BIST controller.
Figure 12:
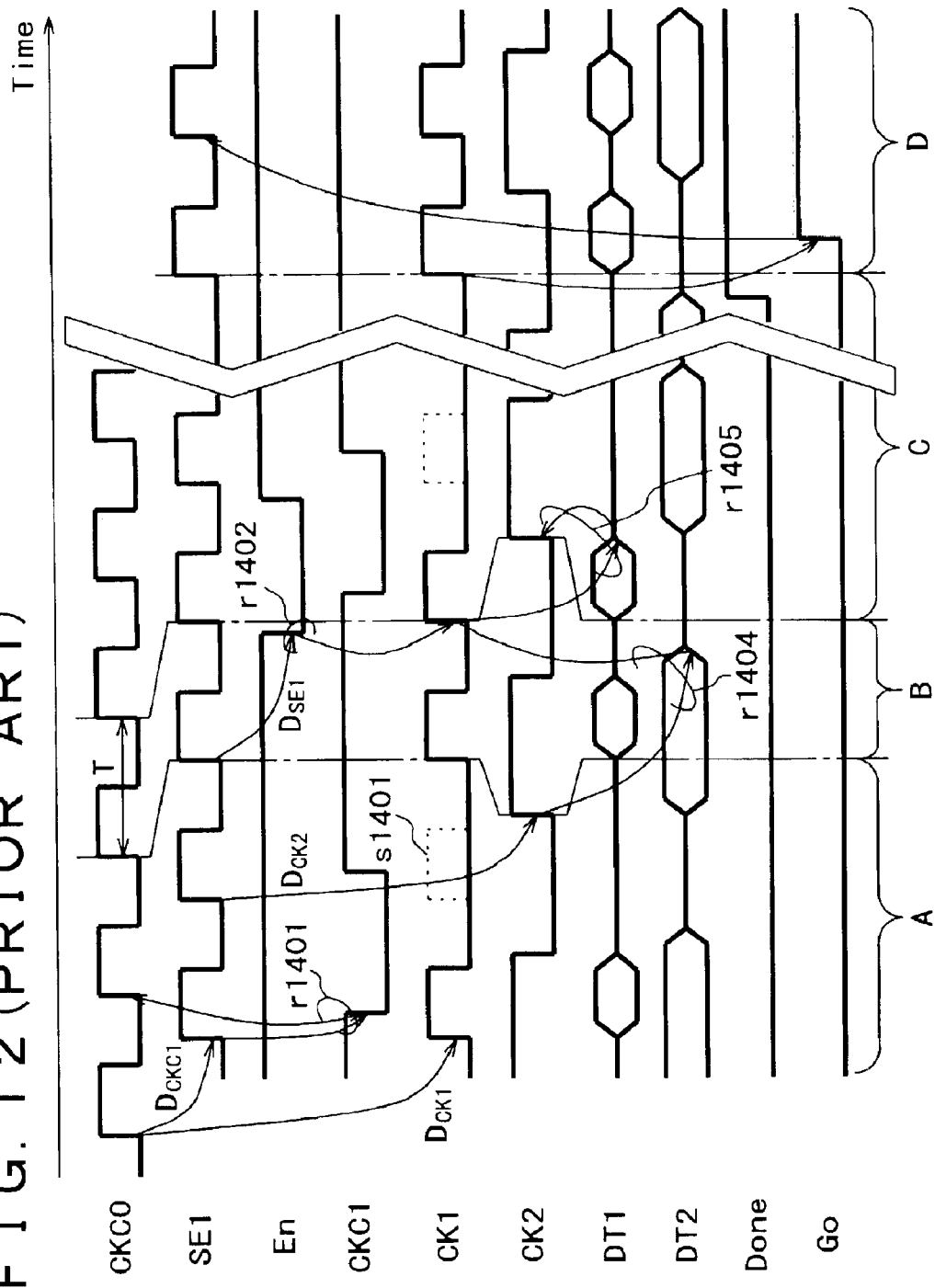
FIG. 12 (PRIOR ART) is a timing chart showing operations of the conventional logic BIST controller.

FIG. 2 is a timing chart showing operations of the configuration discussed with reference to FIG. 1, in accordance with one embodiment of the present invention. The control signal generator FSM outputs the scan enable signals SE1 and SE2 and the clock signal CKC4 whose phases advance further than that of the clock signal CK1. Accordingly, delays of these signals are partly offset in accordance with the fan-out count sizes. As a result, the user circuit CUT receives the scan enable signals SE1 and SE2 and the clock signals CK1 and CK2 all of which have almost the same phases. According to the configuration discussed with reference to FIG. 11 (PRIOR ART), the control signal generator FSM outputs the scan enable signals SE1 and SE2 and the clock signal CKC4 whose phases follow that of the clock signal CK1. This may elicit a delay on the signal path. The configuration of the present invention can hide a delay on the signal path and provide the scan enable signal and the clock signal with almost the same delay. This makes it easy to satisfy setup time and hold time restrictions. Finally, the clock cycle can be shortened. While the clock cycle T is made shorter than delay DSE1 of the scan enable signal and delays DCK1 and DCK2 of the clock signal, it is possible to satisfy the setup time restrictions (r401 to r403) and the hold time restriction (r404). Accordingly, the present invention can apply logic BIST at speed for large-scale and high-performance logic circuits without increasing the test time. As a result, test costs can be saved.

Further, a fault determination signal Go allows the control signal generator FSM to determine whether or not there is a fault. The fault determination signal Go should be designed to use one or more clock cycles (s406, hereafter referred to as the multiple-clock-cycle transfer design.) This is because the setup time restriction (r405) is satisfied for the fault determination signal Go. If a design stage is configured to determine a cycle for the control signal generator FSM to await the fault determination signal Go, a known technology can be used to implement the multiple-clock-cycle transfer. The example in FIG. 2 is configured to receive the fault determination signal Go after two cycles.

When one or more clock signals drives the user circuit CUT as shown in FIG. 1, the number of FFs driven by the clock signal CK1 may be larger than the number of FFs driven by clock signal CK2. In this case, a delay off the clock signal CK2 may be smaller than that of the clock signal CK1. A delay of the scan enable signal SE2 may be smaller than that of the scan enable signal SE1. Since theses delays are preferably the same, the delays are adjusted by providing delay circuits to signal paths for the clock signal CK2 and the scan enable signal SE2. The same applies when the number of FFs driven by the clock signal CK1 is smaller than the number of FFs driven by clock signal CK2.

FIG. 5 is a configuration example of the delay circuits DY1 and DY2, in accordance with one embodiment of the present invention. A buffer or a latch can be used to configure each delay circuit. The delay circuit using a latch is capable of a delay for a half cycle of the clock signal CKC0. Such delay circuit is suitable for the delay circuit DY1 requiring a long delay time. On the other hand, a buffer can be used to configure a delay circuit requiring a short delay time, for example, a delay circuit that adjusts a delay between the clock signals CK1 and CK2.

Figure 3:
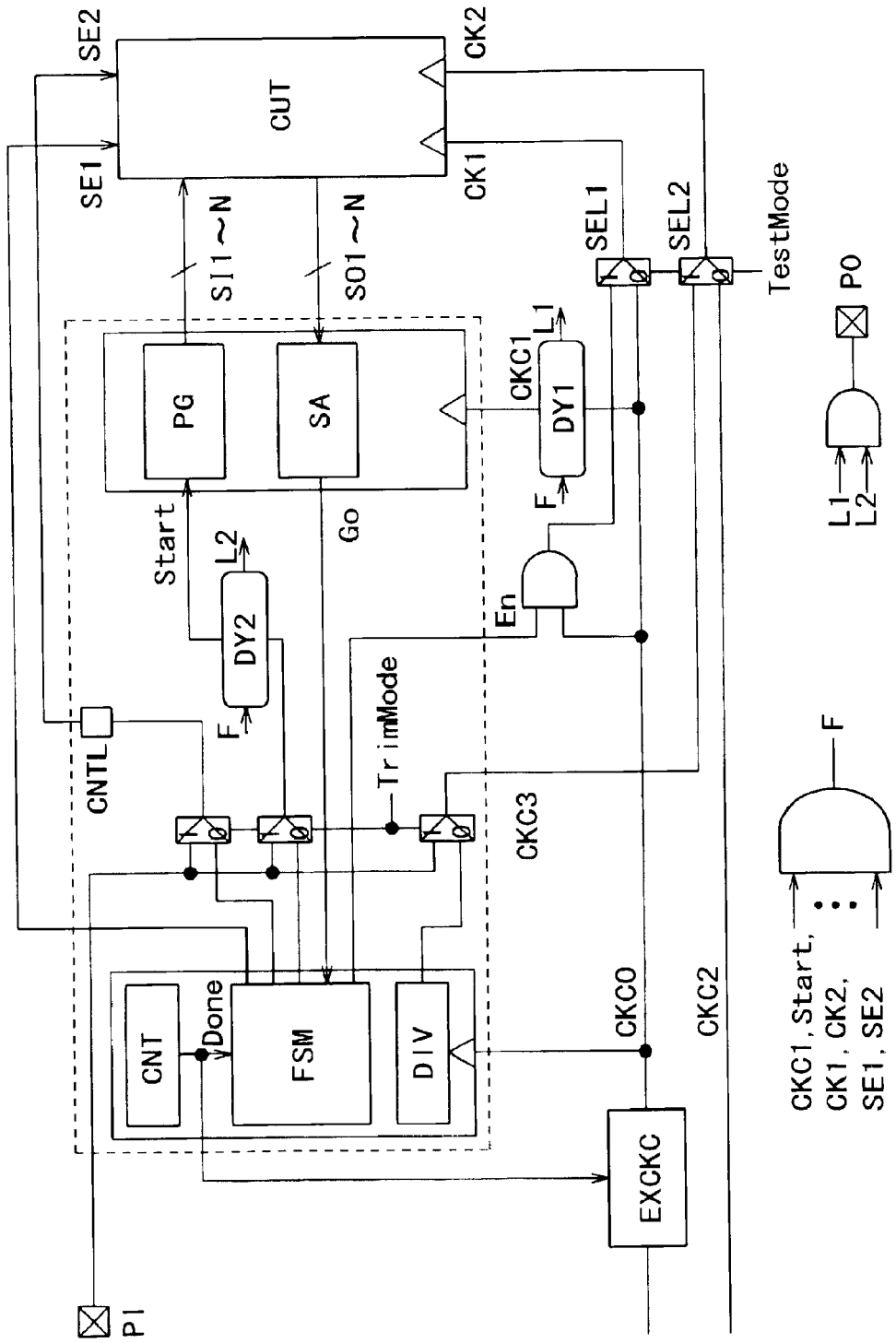
FIG. 3 is a configuration example of the delay circuits DY1 and DY2, in accordance with one embodiment of the present invention.

FIG. 3 is another circuit configuration diagram of the embodiment discussed with reference to FIG. 1, in accordance with one embodiment of the present invention. This configuration has provision for a clock cycle extension circuit EXCKC. A system clock signal CKC00 and a test completion signal Done are input to the cycle extension circuit EXCKC. This configuration eliminates the need for the above-mentioned multiple-clock-cycle transfer design. Operations of the clock cycle extension circuit EXCKC will now be described with reference to the timing chart in FIG. 4. A test operation has been completed according to each test pattern. A test completion signal Done goes to the High level. Then, the cycle for the system clock signal CKC0 is extended (s201). The clock cycle is so extended as to satisfy the setup time restriction on the fault determination signal Go (s202).

Figure 6:
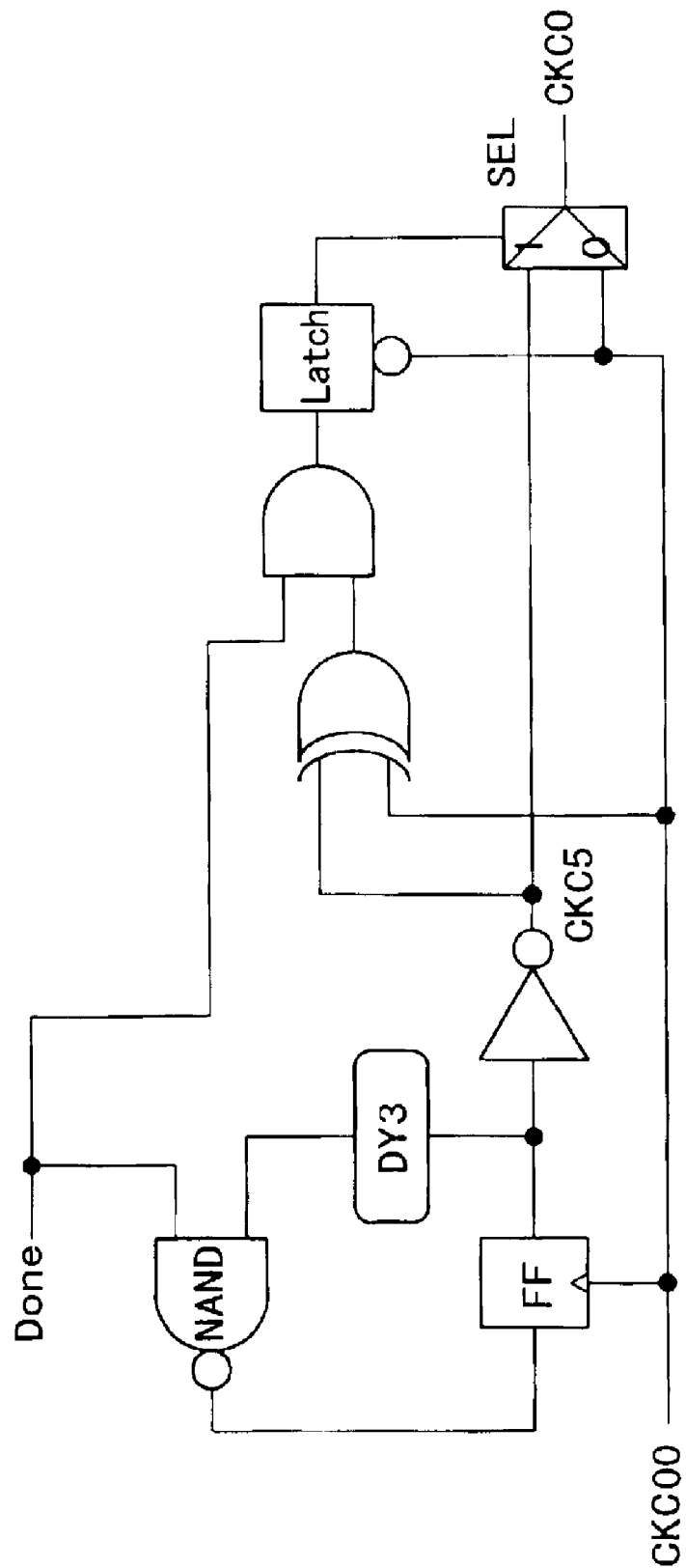
FIG. 6 shows a circuit configuration example of the clock cycle extension circuit, in accordance with one embodiment of the present invention.

FIG. 6 shows a circuit configuration example of the clock cycle extension circuit EXCKC, in accordance with one embodiment of the present invention. A delay circuit DY3, a 2-input NAND gate NAND, and a flip-flop FF form a loop circuit. The loop circuit accepts an input from the system clock signal CKC00 and generates a clock signal CKC5 having a cycle twice as long as a delay generated from the delay circuit DY3. When the test completion signal Done goes to the High level, the clock signal CKC5 with the extended cycle passes through a selector SEL and is output to a clock signal line CKC0.

Figure 4:
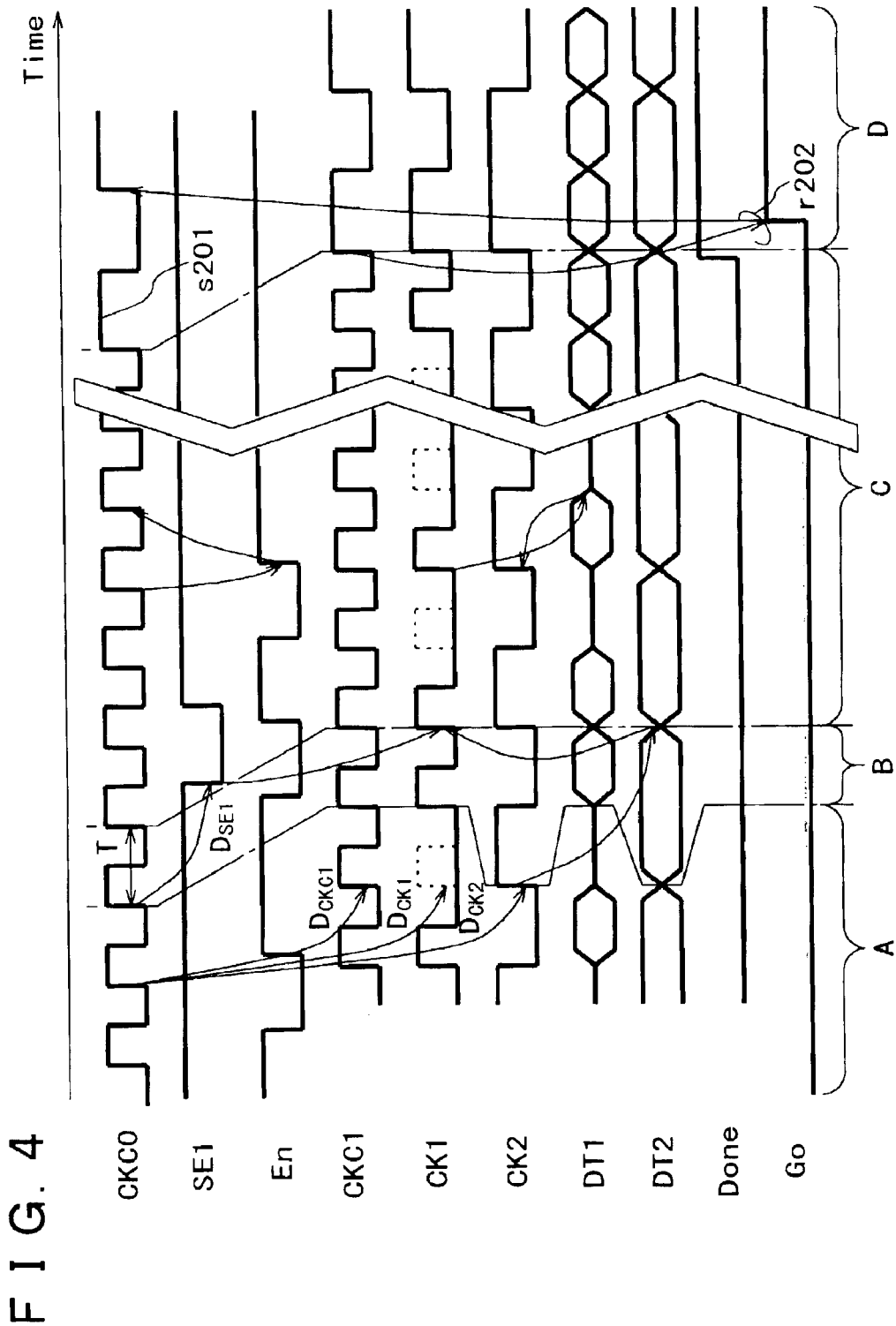
FIG. 4 is another circuit configuration diagram of the embodiment discussed with reference to FIG. 1, in accordance with one embodiment of the present invention.

The configuration discussed with reference to FIG. 4 also has a provision for delay compensation circuits DYC1 and DYC2 instead of the delay circuits DY1 and DY2 for the logic BIST controller. The delay compensation circuits DYC1 and DYC2 are supplied with a compensation reference signal F and output compensation completion signals (L1, L2). When logic BIST is applied by greatly changing the operating voltage or temperature, a delay of the clock signal CKC1 or the pattern generation start signal Start largely differs from a delay of any of the clock signals CK1 and CK2 and the scan enable signals SE1 and SE2. This is caused by differences in signal line shapes according to the first configuration example that provides a fixed amount of delays. This phenomenon tends to become obvious as devices are manufactured more finely. Because of this, the delay time needs to be configured to be capable of compensation before execution of the BIST. This configuration can easily improve operating frequencies even when logic BIST is applied by greatly changing the operating voltage or temperature.

The compensation reference signal F uses the scan enable signal SE1, SE2, the clock signal CKC1, CK1, CK2, or the pattern generation start signal Start that has the largest delay. Alternatively, it may be preferable to predetermine any of these signals in advance so as to be used as a reference.

The compensation time is adjusted as follows. The tester sets trimming mode TrimMode to the High level and inputs a regular signal from a compensation reference signal input terminal PI. Setting the trimming supplies the user circuit CUT with a signal from the terminal PI instead of the scan enable signal and the pattern generation start signal Start. Since these signals rarely change, it is intended to increase the number of changes and facilitate the delay time adjustment. Accordingly, clock signals may be supplied from the terminal PI or from the original system clock terminal.

Figure 7:
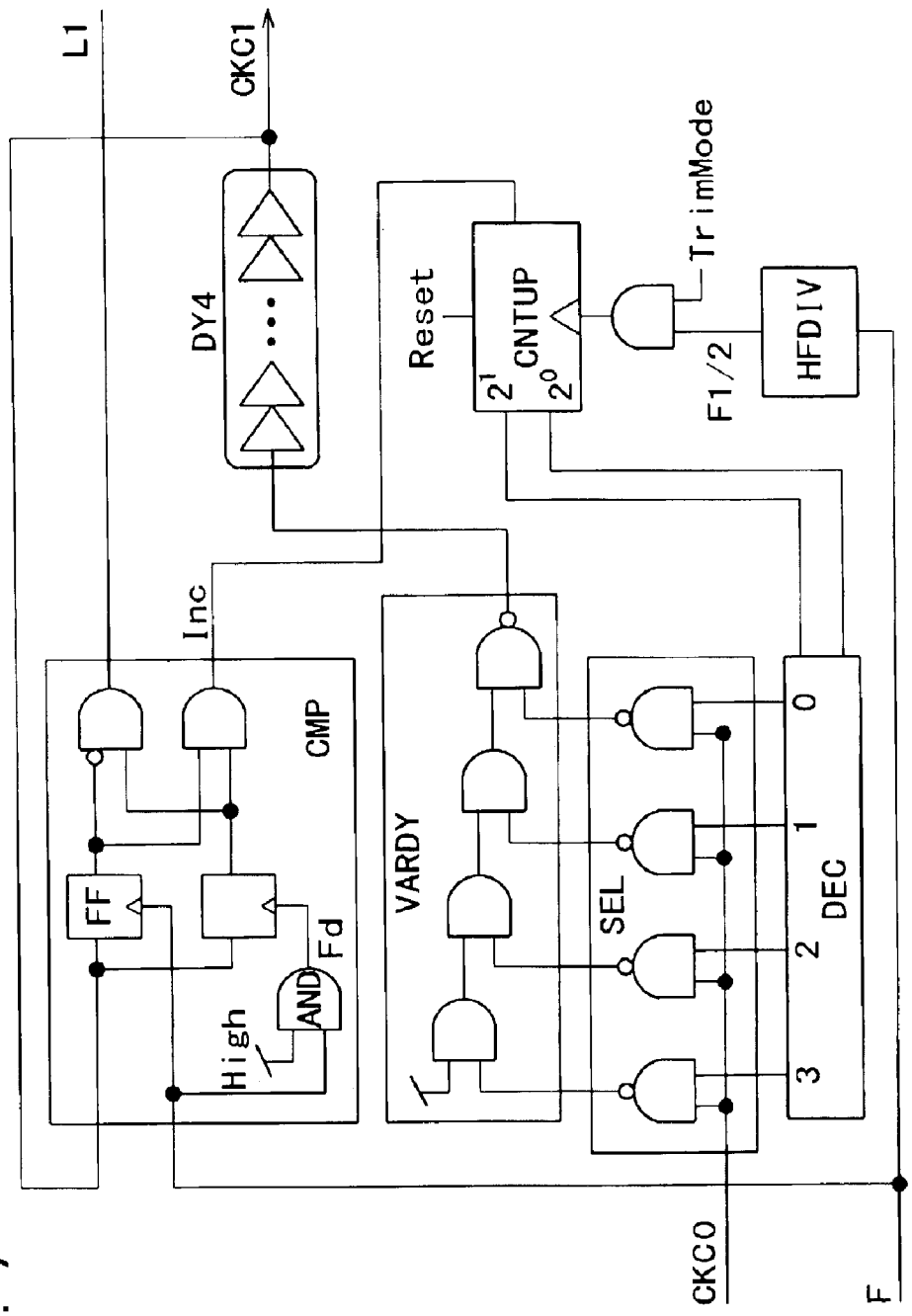
FIG. 7 shows a circuit configuration example of the delay compensation circuit, in accordance with one embodiment of the present invention.

FIG. 7 shows a circuit configuration example of the delay compensation circuit DYCL, in accordance with one embodiment of the present invention. The signal CKC0 is input as a compensation input signal and the signal F is input as a compensation reference signal. When a reset signal Reset is input, a decoder DEC specifies the first stage of a variable delay circuit VARDY. A signal delayed in the VARDY and a delay circuit DY4 is output as a compensation output signal CKC1. The delay comparison circuit CMP compares the compensation output signal CKC1 with the compensation reference signal F. When delaying the compensation input signal CKC0, the delay comparison circuit CMP outputs a delay increment signal Inc to a counter CNTUP. The counter CNTUP changes a selection position of the variable delay circuit VARDY. A frequency divider HFDIV is provided to compensate control timing of the counter CNTUP. When the compensation output signal CKC0 synchronizes with the compensation reference signal F, a compensation completion signal L1 is output. A delay compensation circuit DYC2 has the similar configuration. A difference is that a signal from the compensation reference signal input terminal PI is used as the compensation input signal.

Figure 8:
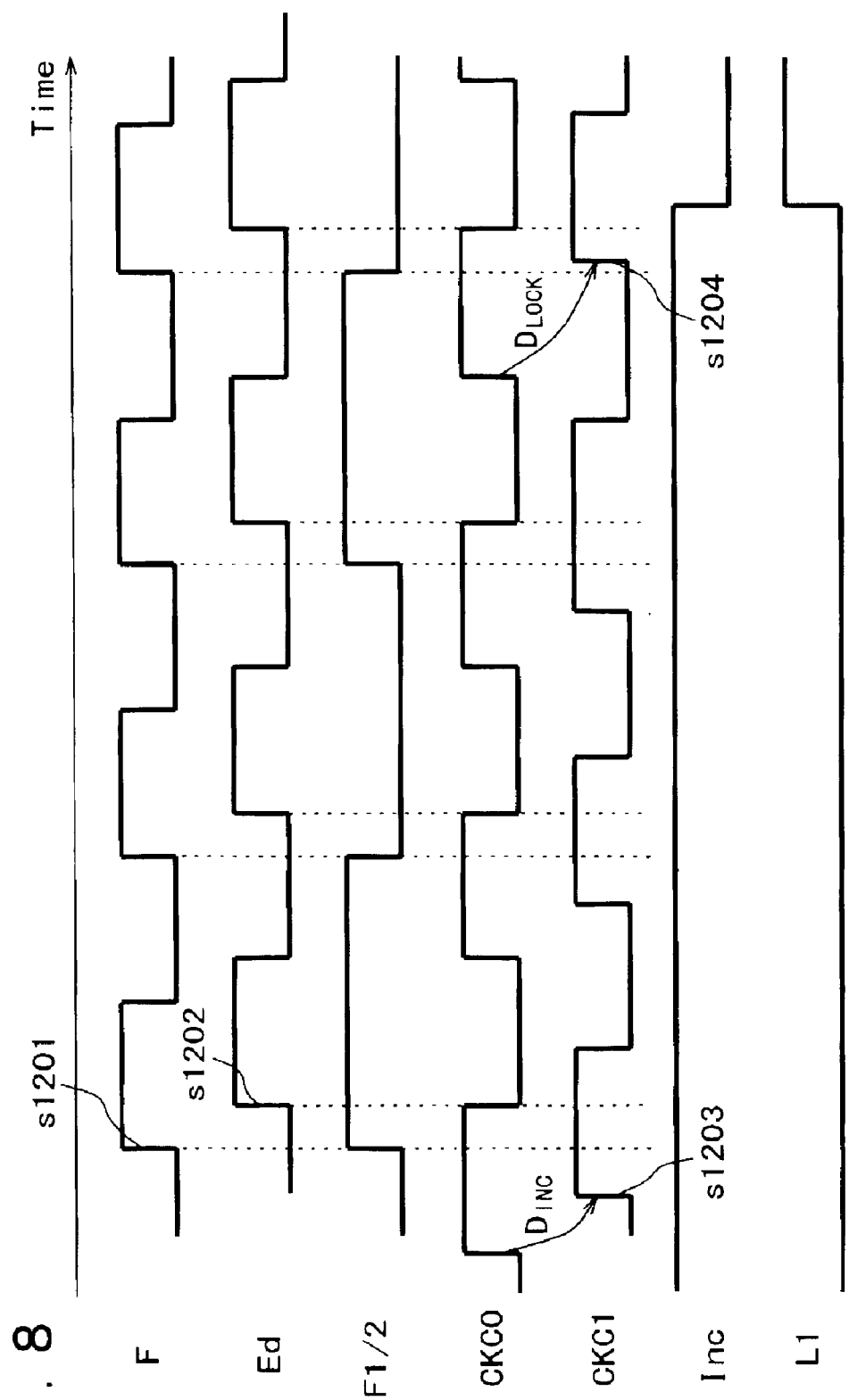
FIG. 8 is a timing chart showing operations of the delay compensation circuit, in accordance with one embodiment of the present invention.

FIG. 8 is a timing chart showing operations of the delay compensation circuit DYC1, in accordance with one embodiment of the present invention. The chart shows signal waveforms before and after completion of the delay compensation for the compensation output signal. Whether or not the compensation output signal is compensated is determined by detecting whether or not there are rising edges (s1203 and s1204) of the compensation output signal between a rising edge s1201 of the compensation reference signal F and a rising edge s1202 of a reference delay signal Fd generated by letting the signal F pass through a 2-input AND gate AND. That is to say, when delay DINC of the compensation output signal is small, the delay increment signal Inc goes to the High level because s1203 occurs earlier than s1201. When delay DLOCK of the compensation output signal is large, Inc goes to the Low level and the compensation completion signal L goes to the High level because s1204 occurs between s1201 and s1202.

When the compensation completion signal L1 is output from the delay compensation circuit DYC1 and the compensation completion signal L2 is output from the delay compensation circuit DYC2, the compensation completion signal is output from a compensation completion signal output terminal Pin2. The tester receives the compensation completion signal and sets the trimming mode TrimMode to the Low level. This fixes the value of the counter CNTUP (see FIG. 7). The control signal generator FSM and the frequency divider D1V can output the scan enable signal and the clock signal CK2.

Such a circuit configuration can align delays of the scan enable signal and the clock signal if the operating voltage or temperature is changed greatly, making it possible to easily improve operating frequencies.

Figure 9:
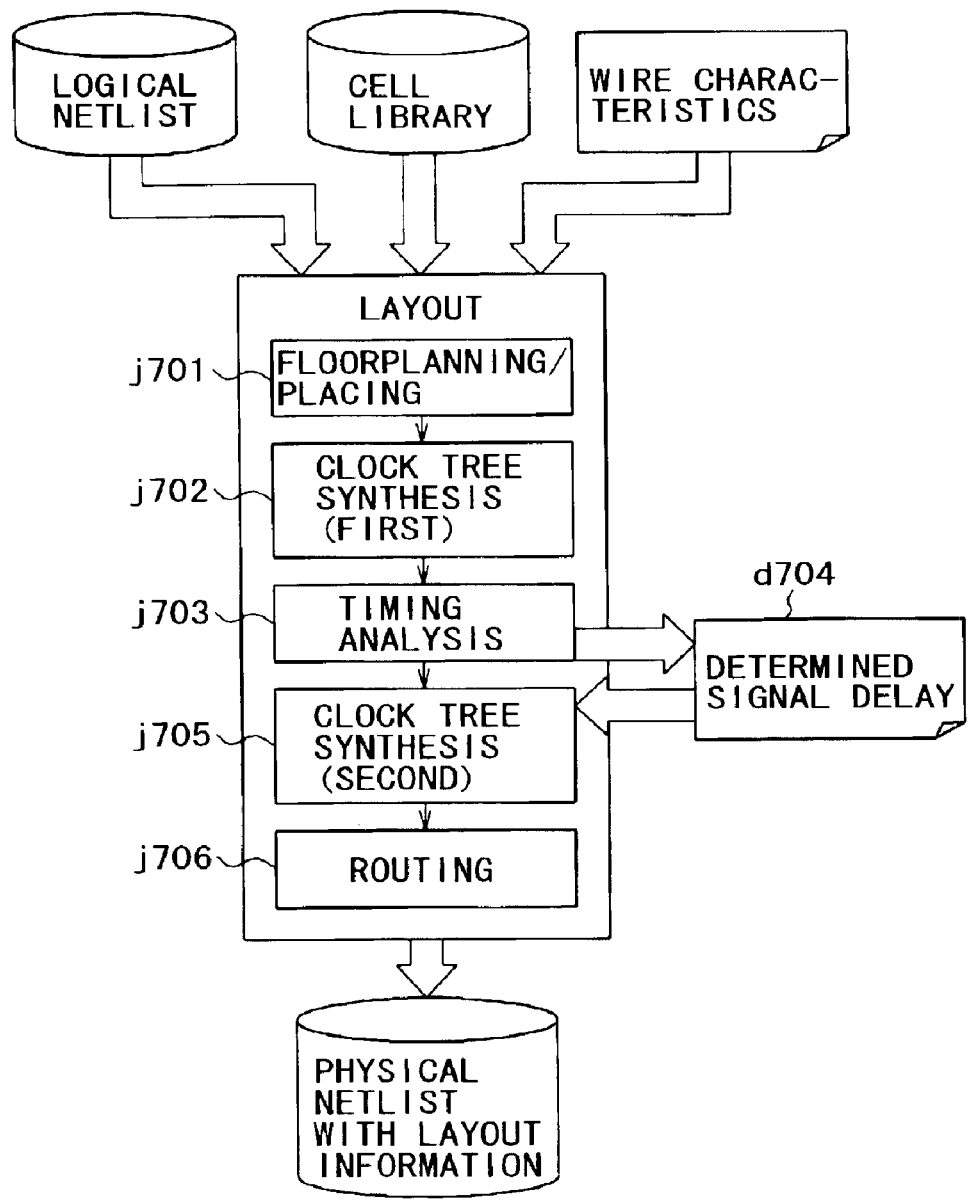
FIG. 9 shows a design flow concerning another embodiment of the present invention, in accordance with one embodiment of the present invention.

FIG. 9 shows a design flow concerning another embodiment of the present invention, in accordance with one embodiment of the present invention. This embodiment exemplifies the design flow for inserting the delay circuits (DY1 and DY2) into the logic BIST controller. The layout design of the semiconductor integrated circuit uses a logical netlist showing logical functions of an integrated circuit to be implemented, a cell library storing information about cells as element circuits for implementing basic function such as an inverter and NAND of the logic circuit. The wire characteristics provides, for example, information such as a sheet resistance and a capacity per unit length of a wire and is used for calculating delays due to wiring.

A floor planning/placing process (j701) arranges cells so as to implement logical functions of the logical netlist. When the logic circuit arrangement is determined, the process determines a clock tree synthesis (first) to be supplied to the logic circuit (j702). The clock tree synthesis (first) process (j702) wires the scan enable signal lines SE1 and SE2 and the clock signal lines CKC0 through CK4 and CK1 through CK2. The process calculates delays for these wired signal lines (j703) and finds a maximum delay value of them. Then, the process creates a determined signal delay d704 assigned with that maximum delay value as a delay for the clock-signal CKC1 and the pattern generation start signal Start. Then, a clock tree synthesis (second) process j705 is used to wire the clock signal line CKC1 and the pattern generation start signal line Start so as to satisfy the delay value indicated by the determined signal delay d704.

Note that it is possible to perform the clock tree synthesis (first) function of a layout tool by specifying a signal name and a delay value. Thereafter, the process wires the other signal lines (j706). Finally, there is provided the logical netlist containing the layout information.

The timing analysis j703 is also performed for the scan enable signal SE1, the clock signal CK1, the scan enable signal SE2, and the clock signal CK2. If necessary, the clock tree synthesis (second) j705 is performed to adjust the delay time. Further, the same method can be used to determine a value of the delay circuit DY3 shown in FIG. 6.

Figure 10:
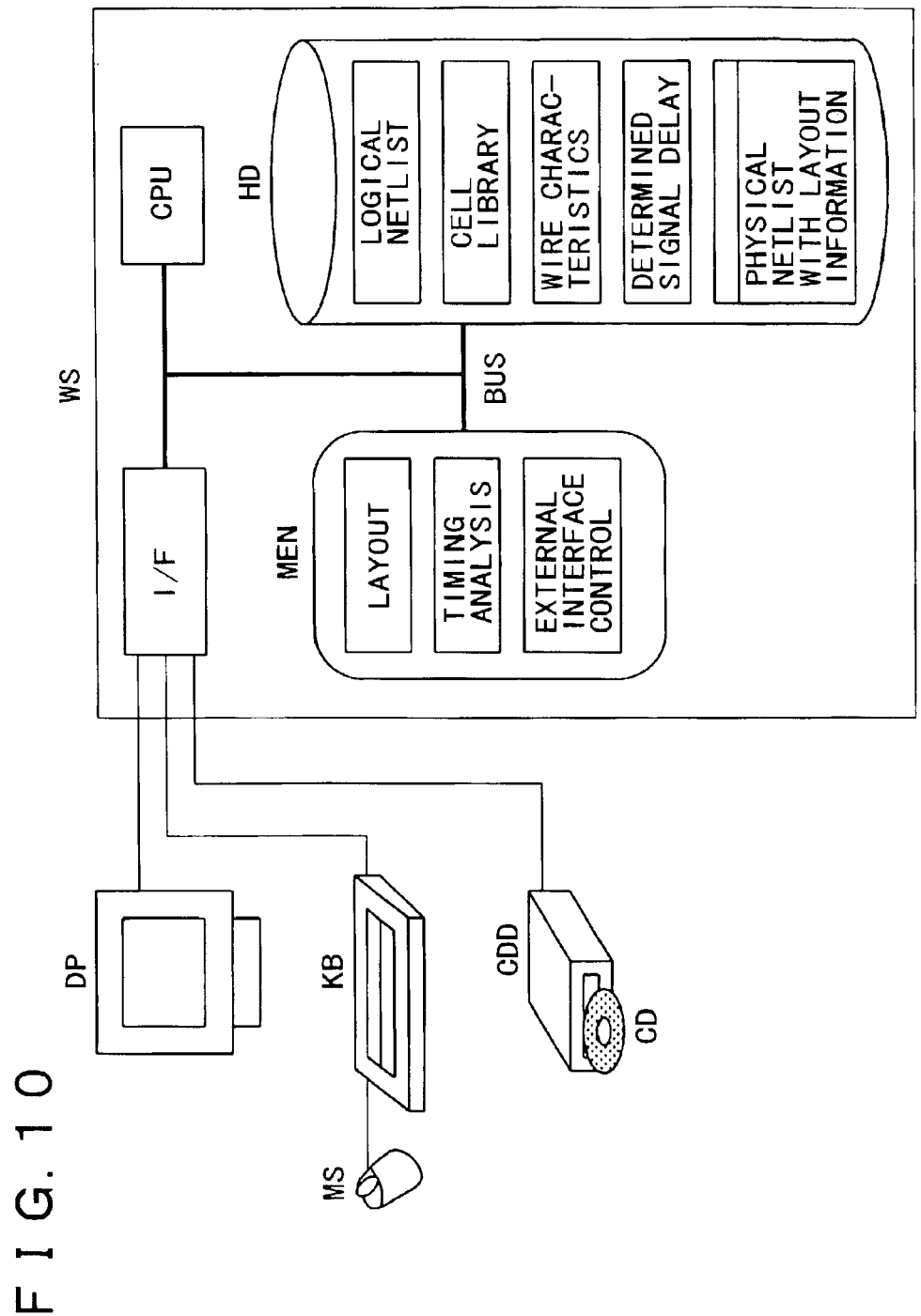
FIG. 10 is a configuration diagram showing a design apparatus and recording media for implementing the design flow discussed with reference to FIG. 9, in accordance with one embodiment of the present invention.

FIG. 10 is a configuration diagram showing a design apparatus and recording media for implementing the design flow discussed with reference to FIG. 9, in accordance with one embodiment of the present invention. A design apparatus for implementing the semiconductor integrated circuit having the logic BIST controller according to the present invention can be implemented as a workstation WS comprising memory MEM, a processor CPU, an external storage HD, and an external interface I/F.

The memory MEM stores a layout program to perform cell arrangement, a timing analysis program to perform the timing analysis, and an external interface control program to control the external interface I/F. The external storage HD stores data representing the logical netlist, the cell library, the wire characteristics, the determined signal delay, and the physical netlist with layout information. An input from a keyboard KB or a mouse MS operates and executes the programs. An execution result of each program can be output to a display DP for confirmation. All the stored programs and data can be input to or output from a compact disk drive CDD and can be stored and distributed in the form of a compact disk CD. The compact disk is just an example, and the present invention is not limited thereto. It may be also preferable to use magnetic recording media, optical recording media, and the like.

What is claimed is:

1. A semiconductor integrated circuit comprising:
   a logic circuit including having one or more flip-flops and one or more combinational circuits; and
   a test control circuit including,
      a control circuit configured to output a control signal for controlling connection states of the one or more flip-flops, and
      a pattern generation circuit configured to generate a test pattern for the logic circuit, wherein when the control signal is in a first state, each of the one or more flip-flops is connected to other flip-flops without passing through the one or more combinational circuits and transmits a test pattern generated from the pattern generation circuit to the other flip-flops, and wherein when the control signal is in a second state, each of the one or more flip-flops is connected to any of the one or more combinational circuits and outputs a stored test pattern to a connected combinational circuit, and wherein a phase of a clock signal to drive the control circuit advances further than a phase of a clock signal to drive the pattern generation circuit.

2. The semiconductor integrated circuit of claim 1, wherein a phase of a clock signal to drive the one or more flip-flops equals a phase of a clock signal to drive the pattern generation circuit.

3. The semiconductor integrated circuit of claim 1, wherein a clock signal source supplies the clock signal to the control circuit, wherein the pattern generation circuit is supplied with a second clock signal which is supplied from the clock signal source and is delayed in the delay circuit by a delay amount.

4. The semiconductor integrated circuit of claim 1, wherein when the control signal is in a second state, the one or more flip-flops comprises one or more first flip-flops driven by a first flip-flop clock signal and one or more second flip-flops driven by a second flip-flop clock signal, wherein the first flip-flop clock signal and the second flip-flop clock signal operate synchronously, wherein a delay and phase for the first flip-flop clock signal equals a delay and phase for the second flip-flop clock signal;
   the control signal including a first control signal to control the one or more first flip-flops and a second control signal to control the one or more second flip-flops;
   the test control circuit including a frequency divider to generate the second flip-flop clock signal for the second flip-flop, wherein the frequency divider is driven by the clock signal to drive the control circuit.

5. The semiconductor integrated circuit of claim 1, wherein the control circuit generates a pattern generation start signal to allow the pattern generation circuit to generate the test pattern, wherein the control circuit inputs the pattern generation start signal to the pattern generation circuit via a delay circuit.

6. The semiconductor integrated circuit of claim 3, wherein the delay amount for the delay circuit is configured to be variable.

7. The semiconductor integrated circuit of claim 6, wherein the semiconductor integrated circuit is configured to compensate the delay of the delay circuit by a delay amount compensation and has an output terminal to output a delay compensation completion signal indicating completion of the delay amount compensation.

8. A method of designing a semiconductor integrated circuit including a logic circuit having one or more flip-flops, one or more combinational circuits, and a test control circuit having a control circuit to output a control signal for controlling connection states of the flip-flops and a pattern generation circuit to generate a test pattern for the logic circuit, the method comprising:
   arranging the logic circuit and the test control circuit;
   performing a clock tree synthesis for the logic circuit and the test control circuit;
   calculating a first delay of a first clock signal supplied to the flip-flops of the logic circuit and a second delay of a second clock signal supplied to the pattern generation circuit of the test control circuit; and
   performing another clock tree synthesis.

9. The method of claim 8, further comprising providing a delay circuit between a clock signal source and the pattern generation circuit.

10. The method of claim 8, wherein the step of performing another clock tree synthesis includes the step of rewiring clock routing to the pattern generation circuit so as to decrease a difference between the first delay and the second delay.

* * * * *